(12) United States Patent
Yoon et al.

(10) Patent No.: US 10,319,684 B2
(45) Date of Patent: Jun. 11, 2019

(54) DUMMY CONDUCTIVE STRUCTURES FOR EMI SHIELDING

(71) Applicant: STATS ChipPAC Pte. Ltd., Singapore (SG)

(72) Inventors: InSang Yoon, Seoul (KR); SeungYong Chai, Incheon (KR); SoYeon Park, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 15/485,085

(22) Filed: Apr. 11, 2017

(65) Prior Publication Data

US 2018/0294233 A1 Oct. 11, 2018

(51) Int. Cl.
*H01L 21/48* (2006.01)
*H01L 21/56* (2006.01)
(Continued)

(52) U.S. Cl.
CPC .......... *H01L 23/552* (2013.01); *H01L 21/485* (2013.01); *H01L 21/4853* (2013.01); *H01L 21/4857* (2013.01); *H01L 21/565* (2013.01); *H01L 21/76898* (2013.01); *H01L 21/78* (2013.01); *H01L 23/3114* (2013.01); *H01L 23/49822* (2013.01); *H01L 23/49838* (2013.01); *H01L 23/5389* (2013.01); *H01L 24/81* (2013.01); *H01L 24/97* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16227* (2013.01); *H01L 2224/81815* (2013.01); *H01L 2224/97* (2013.01)

(58) Field of Classification Search
CPC ............... H01L 21/78; H01L 21/76898; H01L 23/5389; H01L 21/4853; H01L 21/485
See application file for complete search history.

(56) References Cited

U.S. PATENT DOCUMENTS 8,350,367 B2   1/2013   Chiu et al.
8,709,874 B2   4/2014   Chew et al.
(Continued)

*Primary Examiner* — Ngan V Ngo
(74) *Attorney, Agent, or Firm* — Brian M. Kaufman; Robert D. Atkins; Patent Law Group: Atkins and Associates, P.C.

(57) ABSTRACT

A semiconductor device has a first conductive layer and a second conductive layer. A first portion of the first conductive layer is aligned with a first portion of the second conductive layer. An insulating layer is deposited over the first conductive layer and second conductive layer. A third conductive layer includes a first portion of the third conductive layer vertically aligned with the first portion of the first conductive layer and the first portion of the second conductive layer. An electrical component is disposed over the first conductive layer and second conductive layer. An encapsulant is deposited over the first conductive layer, second conductive layer, and electrical component. A cut is made through the encapsulant, first conductive layer, and second conductive layer. A fourth conductive layer is deposited over side surfaces of the first conductive layer, second conductive layer, and encapsulant.

20 Claims, 12 Drawing Sheets

(51) Int. Cl.
*H01L 21/78* (2006.01)
*H01L 23/00* (2006.01)
*H01L 23/31* (2006.01)
*H01L 21/768* (2006.01)
*H01L 23/498* (2006.01)
*H01L 23/538* (2006.01)
*H01L 23/552* (2006.01)

(56) References Cited

U.S. PATENT DOCUMENTS

| | | | | |
|---|---|---|---|---|
| 9,691,811 B1* | 6/2017 | Borthakur | | H01L 27/14685 |
| 9,761,565 B2* | 9/2017 | Vincent | | H01L 25/0657 |
| 9,899,353 B2* | 2/2018 | Haba | | H01L 25/0657 |
| 2008/0224298 A1* | 9/2008 | Corisis | | H01L 23/49827 |
| | | | | 257/690 |
| 2009/0160065 A1* | 6/2009 | Haba | | H01L 21/6835 |
| | | | | 257/777 |
| 2009/0294899 A1* | 12/2009 | Pagaila | | H01L 21/6835 |
| | | | | 257/528 |
| 2010/0109164 A1* | 5/2010 | Kang | | H01L 21/76898 |
| | | | | 257/774 |
| 2010/0117176 A1* | 5/2010 | Uekawa | | H01L 27/14618 |
| | | | | 257/432 |
| 2011/0104856 A1* | 5/2011 | Lin | | H05K 1/0204 |
| | | | | 438/118 |
| 2011/0151626 A1* | 6/2011 | Lin | | H01L 33/486 |
| | | | | 438/118 |
| 2012/0217644 A1* | 8/2012 | Pagaila | | H01L 24/03 |
| | | | | 257/774 |
| 2013/0337648 A1* | 12/2013 | Lin | | H01L 21/486 |
| | | | | 438/675 |
| 2014/0048950 A1* | 2/2014 | Lin | | H01L 23/3121 |
| | | | | 257/774 |
| 2014/0054797 A1* | 2/2014 | Gong | | H01L 23/49805 |
| | | | | 257/777 |
| 2014/0246227 A1* | 9/2014 | Lin | | H01L 23/5389 |
| | | | | 174/266 |
| 2014/0262475 A1* | 9/2014 | Liu | | H01L 23/5389 |
| | | | | 174/377 |
| 2015/0155256 A1* | 6/2015 | Lin | | H01L 24/81 |
| | | | | 257/737 |
| 2015/0162310 A1* | 6/2015 | Vincent | | H01L 25/50 |
| | | | | 257/777 |
| 2015/0348865 A1* | 12/2015 | Vincent | | H01L 24/03 |
| | | | | 257/712 |
| 2015/0380386 A1* | 12/2015 | Vincent | | H01L 25/50 |
| | | | | 257/773 |
| 2016/0013076 A1* | 1/2016 | Vincent | | H01L 23/16 |
| | | | | 257/777 |
| 2016/0133608 A1* | 5/2016 | Vincent | | H01L 25/0657 |
| | | | | 257/773 |
| 2016/0163627 A1 | 6/2016 | Hsu et al. | | |
| 2016/0181202 A1* | 6/2016 | Gong | | H01L 23/5389 |
| | | | | 257/762 |
| 2017/0062360 A1* | 3/2017 | Chang | | H01L 23/3121 |
| 2017/0141084 A1* | 5/2017 | Vincent | | H01L 21/78 |
| 2017/0148811 A1* | 5/2017 | Zhang | | H01L 27/11582 |
| 2017/0186711 A1* | 6/2017 | Fang | | H01L 24/02 |
| 2018/0068956 A1* | 3/2018 | Yoo | | H01L 21/02068 |

* cited by examiner

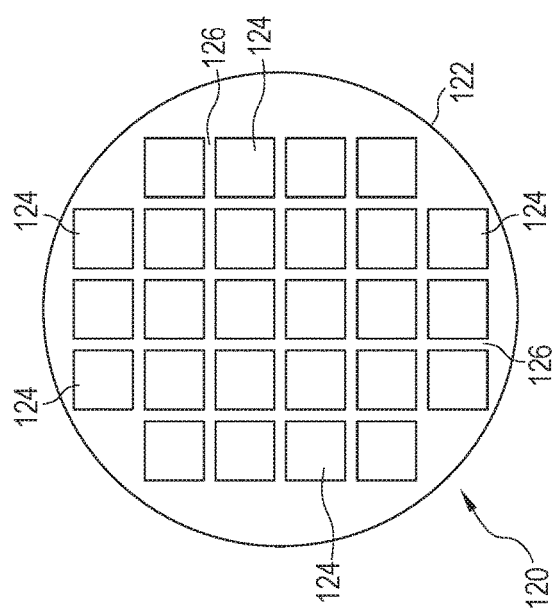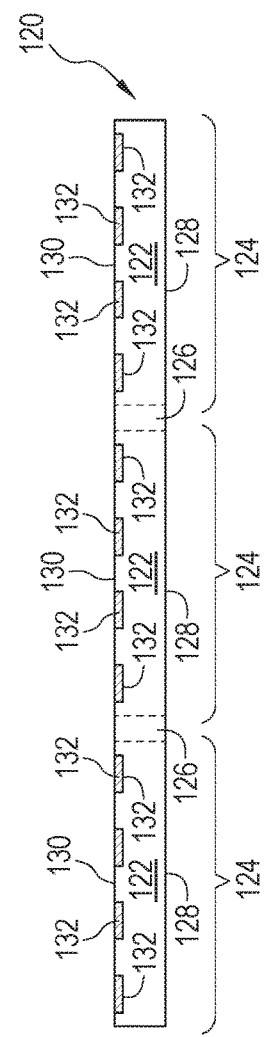

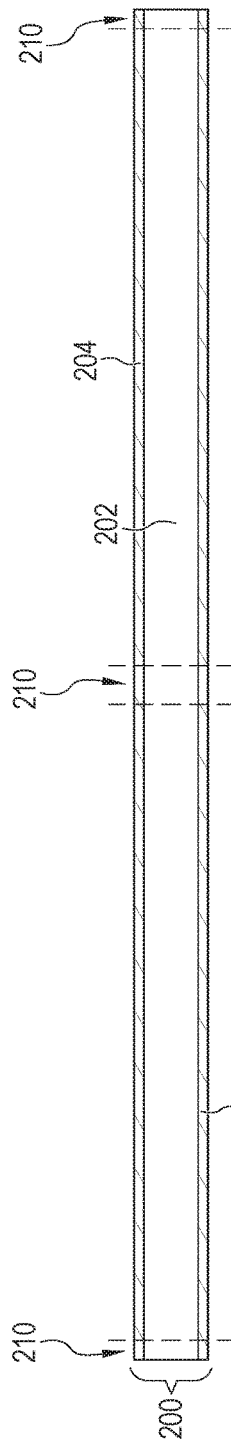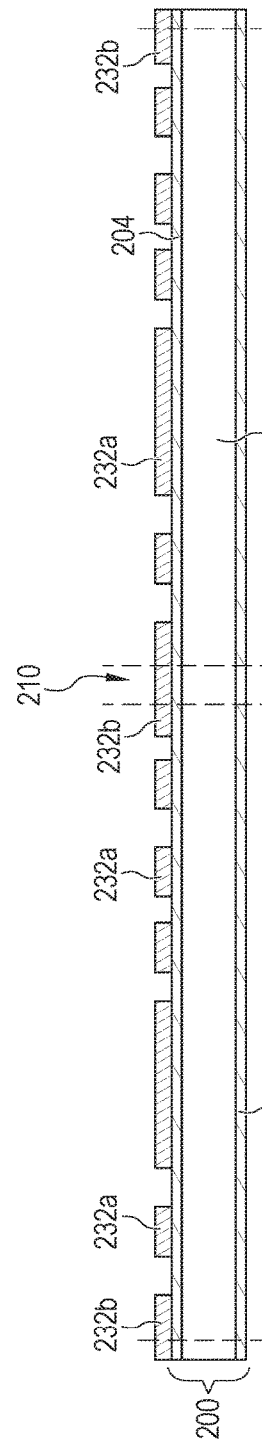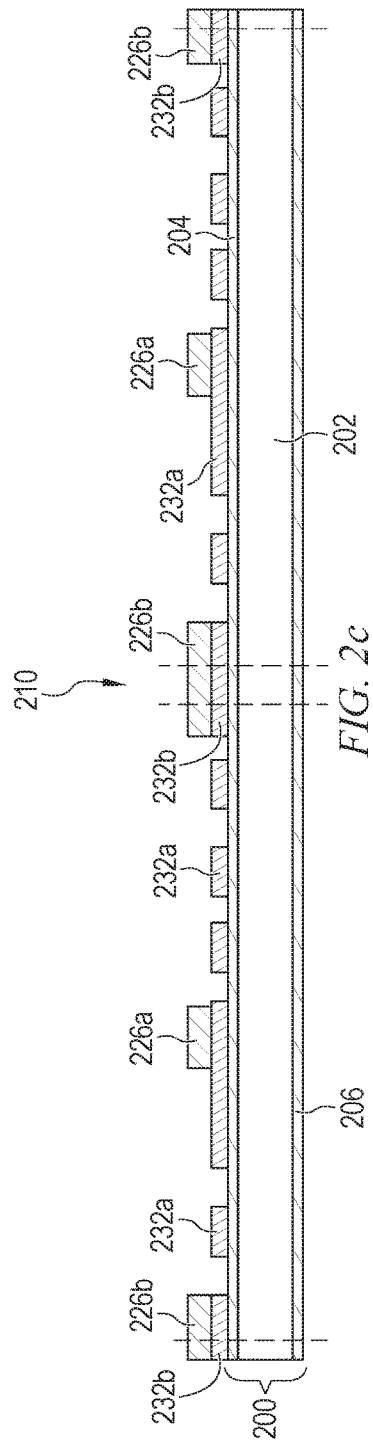

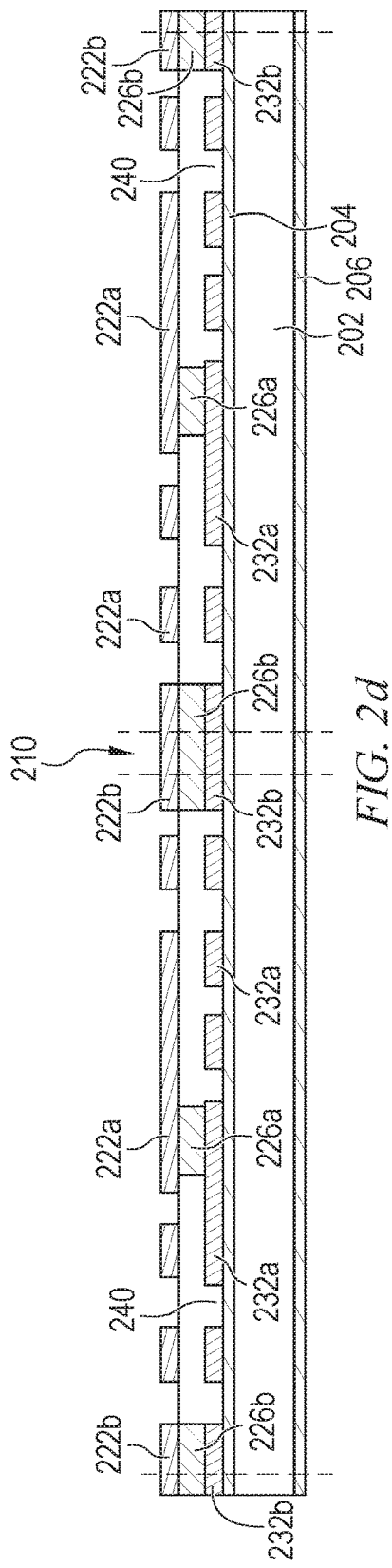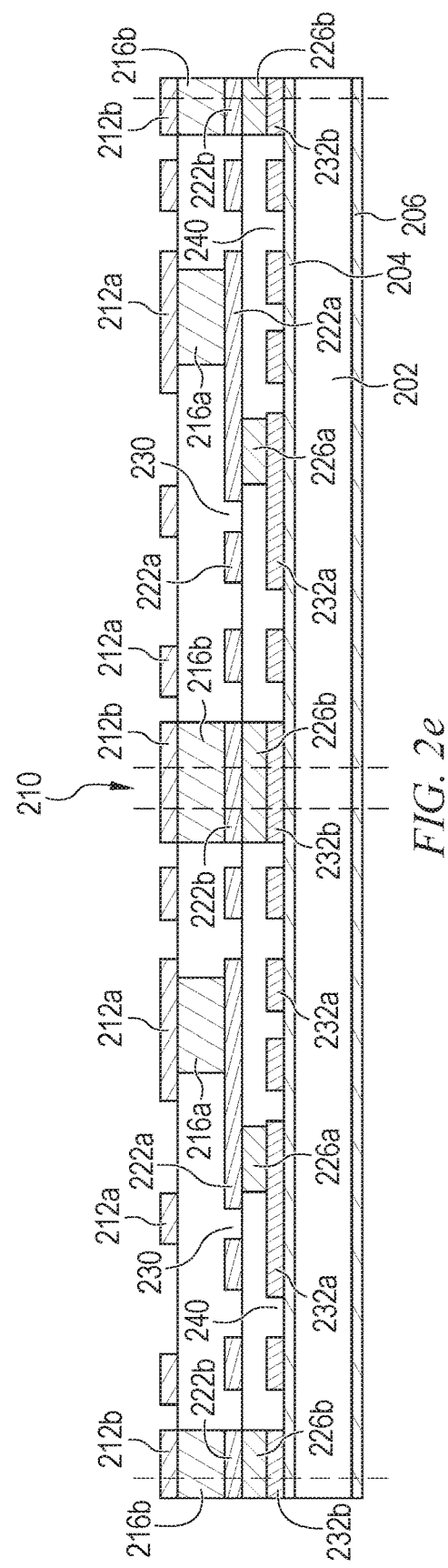

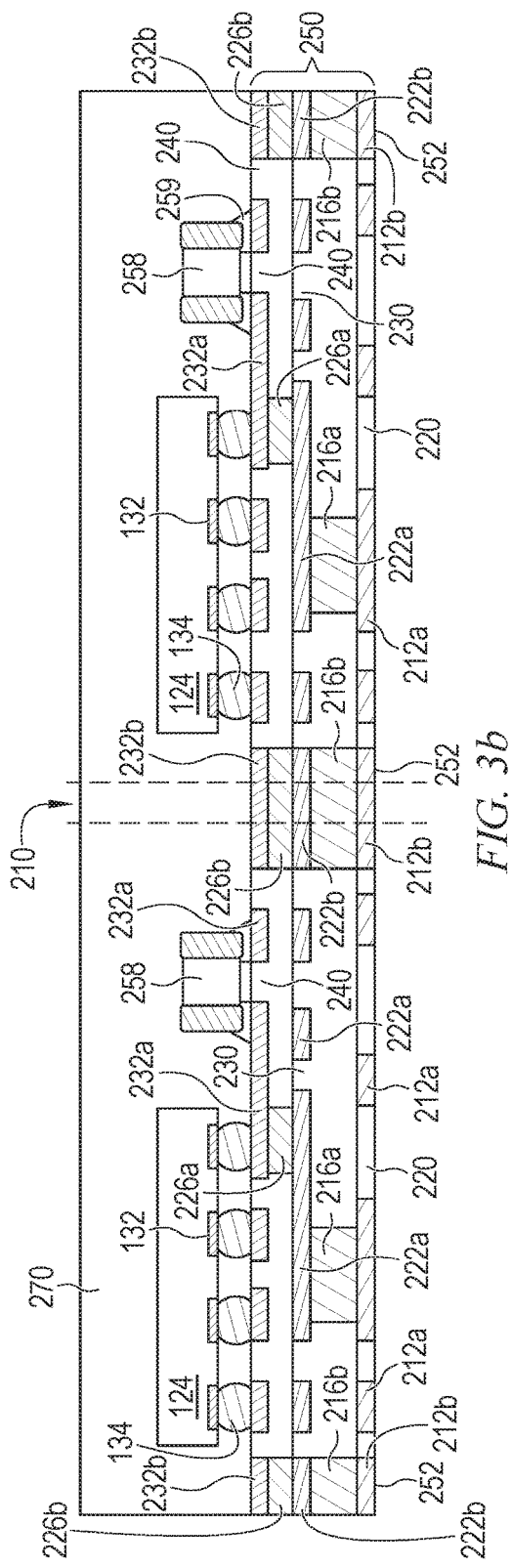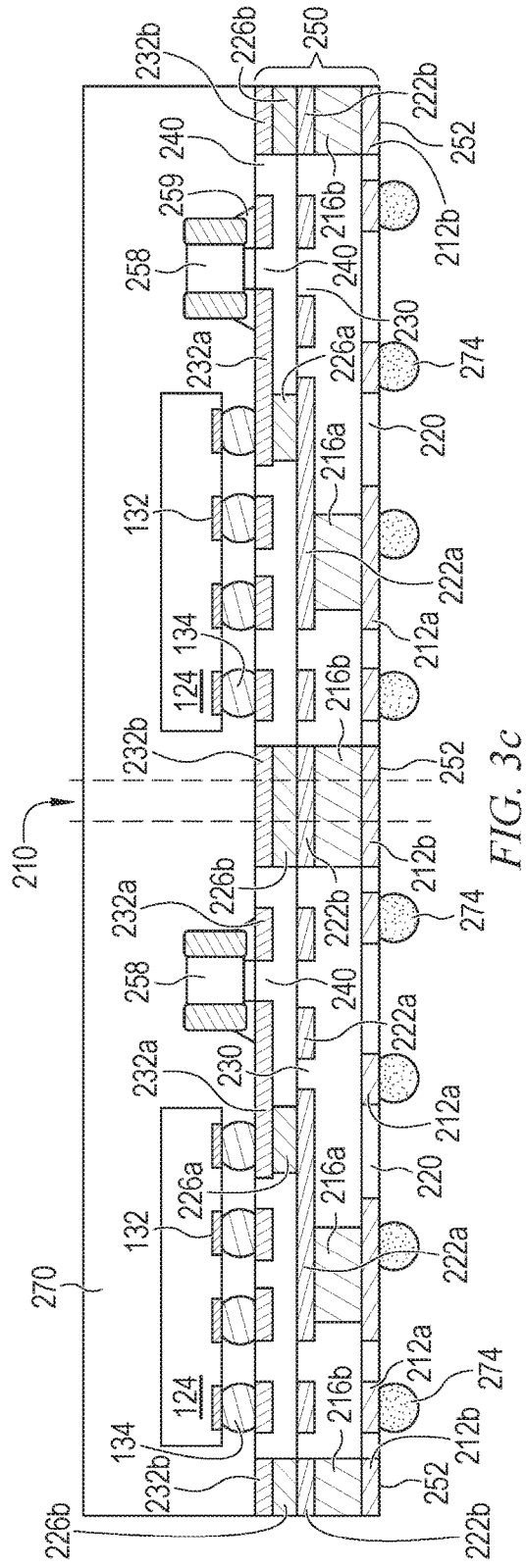

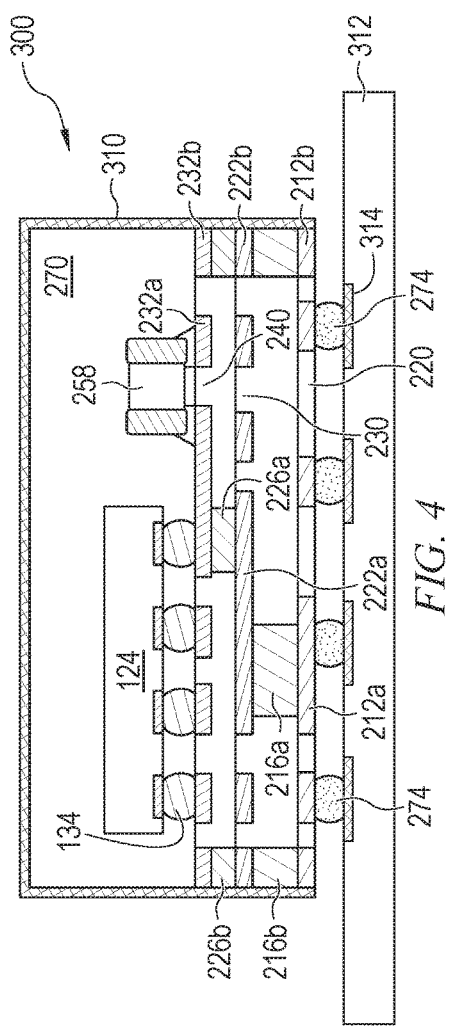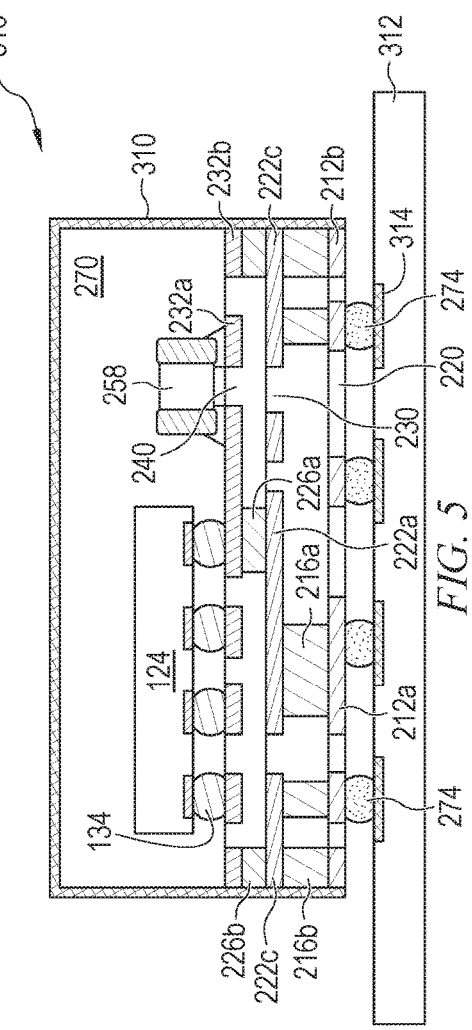

DUMMY CONDUCTIVE STRUCTURES FOR EMI SHIELDING

FIELD OF THE INVENTION

The present invention relates in general to semiconductor devices and, more particularly, to a semiconductor device including a method of forming dummy conductive structures for shielding of electromagnetic interference (EMI).

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. The high-speed switching of digital circuits also generates interference.

Conductive layers are commonly formed over semiconductor packages to shield electronic parts within the package from EMI and other interference. Shielding layers absorb EMI before the signals can hit semiconductor die and discrete components within the package. Some shielding layers are electrically coupled to ground through a package substrate to improve performance. Many challenges exist in forming a shielding layer using a simple process that also has good electrical connectivity to ground.

BRIEF DESCRIPTION OF THE DRAWINGS

FIGS. 1a-1d illustrate a semiconductor wafer with a plurality of semiconductor die separated by a saw street;

FIGS. 2a-2f illustrate a process of forming a package substrate with dummy conductive structures;

FIGS. 3a-3e illustrate a process of forming semiconductor packages using the package substrate with a shielding layer coupled to the dummy conductive structures;

FIG. 4 illustrates one of the semiconductor packages mounted on a printed circuit board;

FIG. 5 illustrates the dummy conductive structures with a connection to ground through conductive layers of the package substrate;

DETAILED DESCRIPTION OF THE DRAWINGS

Figure 1C:
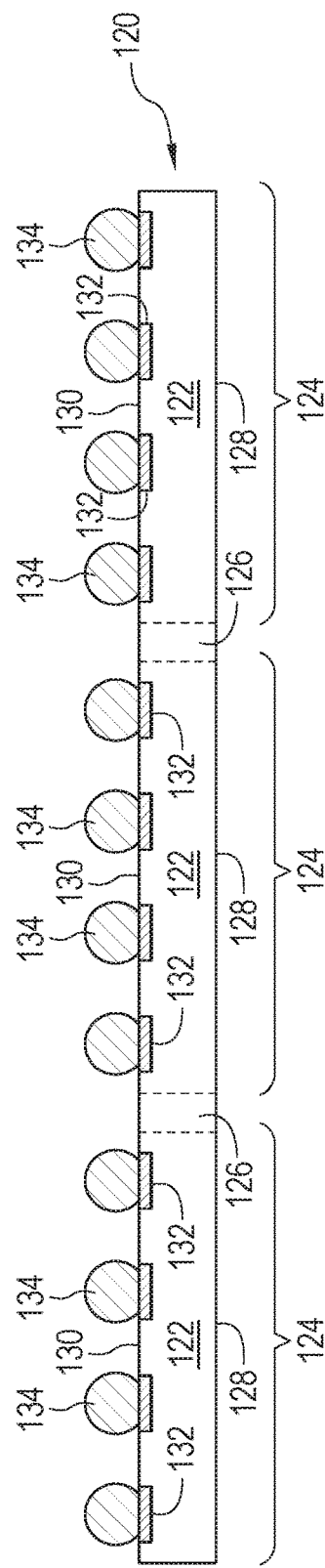

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, wirebonds, or other appropriate interconnect structures. An encapsulant or other molding material is deposited over the package to provide physical support and electrical isolation. The finished package is then inserted into an electrical system and the functionality of the semiconductor device is made available to the other system components.

FIG. 1a shows a semiconductor wafer 120 with a base substrate material 122, such as silicon, germanium, aluminum phosphide, aluminum arsenide, gallium arsenide, gallium nitride, indium phosphide, silicon carbide, or other bulk material for structural support. A plurality of semiconductor die or components 124 is formed on wafer 120 separated by a non-active, inter-die wafer area or saw street 126. Saw street 126 provides cutting areas to singulate semiconductor wafer 120 into individual semiconductor die 124. In one embodiment, semiconductor wafer 120 has a width or diameter of 100-450 millimeters (mm).

FIG. 1b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within and on the semiconductor die and electrically interconnected according to a desired electrical design and function. For example, the circuit may include one or more transistors, diodes, and other circuit elements formed within active surface 130 to implement analog circuits or digital circuits, such as a digital signal processor (DSP), application specific integrated circuits (ASIC), memory, or other signal processing circuit. Semiconductor die 124 may also contain integrated passive devices (IPDs), such as inductors, capacitors, and resistors, for RF signal processing. IPDs are formed in metal layers over active surface 130 in some embodiments.

An electrically conductive layer 132 is formed over active surface 130 using physical vapor deposition (PVD), chemical vapor deposition (CVD), electrolytic plating, electroless plating process, or other suitable metal deposition process. Conductive layer 132 can be one or more layers of aluminum (Al), copper (Cu), tin (Sn), nickel (Ni), gold (Au), silver (Ag), or other suitable electrically conductive material. Conductive layer 132 operates as contact pads electrically connected to the circuits on active surface 130.

In FIG. 1c, an electrically conductive bump material is deposited over conductive layer 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above its melting point to form conductive balls or bumps 134. In one embodiment, conductive bumps 134 are formed over an under bump metallization (UBM) having a wetting layer, barrier layer, and adhesion layer. Conductive bumps 134 can also be compression bonded or thermocompression bonded to conductive layer 132. Conductive bumps 134 represents one type of interconnect structure that can be formed over conductive layer 132 for electrical connection to a substrate. The interconnect structure can also use bond wires, conductive paste, stud bump, micro bump, or other electrical interconnect.

Figure 1D:
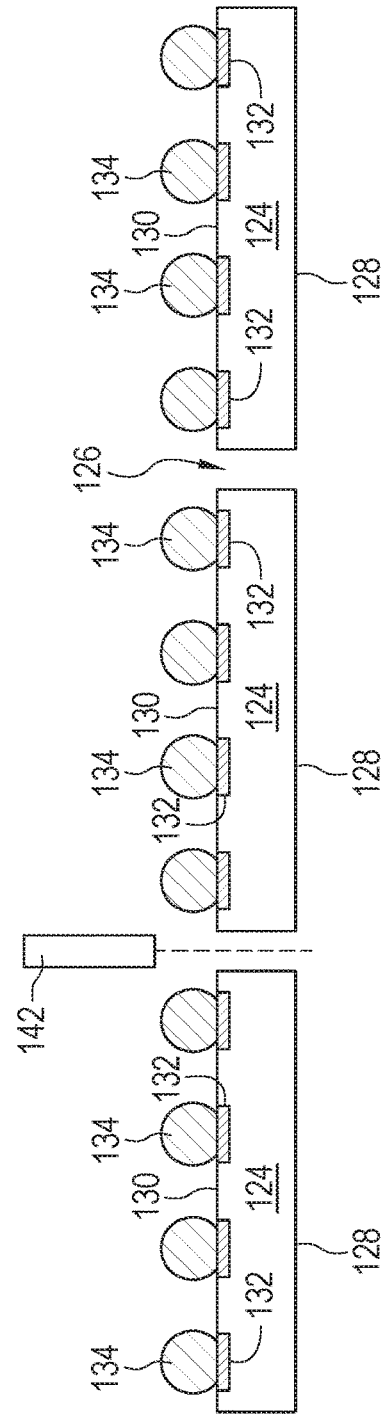

In FIG. 1d, semiconductor wafer 120 is singulated through saw streets 126 using a saw blade or laser cutting tool 142 into individual semiconductor die 124. The individual semiconductor die 124 can be inspected and electrically tested for identification of known good die (KGD) before or after singulation.

FIG. 2a illustrates a carrier 200. Carrier 200 includes a core substrate 202 and seed layers 204 and 206 formed on opposing surfaces of the core substrate. An area of carrier 200 is reserved between device formation areas for saw streets 210. Core substrate 202 includes one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. In one embodiment, core substrate 202 is a composite with woven fiber and filler. Alternatively, core substrate 202 includes one or more insulating or passivation layers. Seed layers 204 and 206 are formed from Cu or another suitable conductive material. In one embodiment, carrier 200 is a copper-clad laminate (CCL).

In FIG. 2b, an electrically conductive layer 232 is formed over seed layer 204 using a patterning and metal deposition process such as printing, PVD, CVD, sputtering, electrolytic plating, or electroless plating. Conductive layer 232 includes one or more layers of Al, Cu, Sn, Ni, Au, Ag, or other suitable electrically conductive material. In one embodiment, a photoresist mask layer is deposited over seed layer 204, and patterned as desired for the formation of conductive layer 232. Conductive material is deposited in openings of the mask layer to form conductive layer 232 directly on seed layer 204. The mask is usually removed after formation of conductive layer 232. Other additive, semi-additive, or subtractive methods of patterning conductive layers are used in other embodiments to form conductive layer 232.

Conductive layer 232 includes separate portions 232a and 232b. Conductive layer 232a is patterned as desired based on the electrical functionality of the package being made, so that the substrate being formed over carrier 200 properly interconnects between devices within the package and a PCB or other substrate that the package will be mounted to. Carrier 200 will eventually be removed and contact pads of conductive layer 232a will form contact pads for semiconductor and other electrical devices to be mounted onto the substrate. Therefore, contact pads of conductive layer 232a should typically be provided at locations where interconnect structures are desired between the substrate and subcomponents of the package being formed. Conductive layer 232a can also include conductive traces to operate as a redistribution layer (RDL), thus routing electrical connections laterally as desired for next-level interconnect within the package substrate being formed.

Conductive layer 232b is a dummy pattern formed across saw streets 210. Conductive layer 232b is referred to as a dummy pattern because the conductive layer is not directly used or necessary for the electrical functionality of the device being formed. In some embodiments, conductive layer 232b is electrically isolated from conductive layer 232a. In other embodiments, some portions of conductive layer 232a are electrically coupled to conductive layer 232b to provide or receive a ground voltage potential. Conductive layer 232b is formed across saw streets 210 so that singulation through the saw streets results in side surfaces of the dummy pattern that are exposed from sides of the substrate being formed. The exposed side surfaces of conductive layer 232b after singulation are used to electrically connect a shielding layer.

In FIG. 2c, conductive pillars 226 are formed over conductive layer 232. Conductive pillars 226 are formed in a similar manner to conductive layer 232, e.g., by depositing conductive material into a patterned photoresist mask. Conductive pillars 226 include conductive pillars 226a over conductive layer 232a, and conductive pillars 226b over conductive layer 232b. Conductive pillars 226a operate as conductive vias in the package substrate, and route functional electrical signals vertically from conductive layer 232a to subsequently formed conductive layers.

Conductive pillars 226b form a dummy pattern similar to conductive layer 232b. In one embodiment, conductive pillars 226b are formed in substantially the same pattern directly on and vertically aligned with conductive layer 232b to form dummy structures with a uniform footprint. Conductive pillars 226b overlap saw streets 210 similar to conductive layer 232b to expose a side surface of the overall dummy structure when singulating the package substrate.

In FIG. 2d, an insulating or passivation layer 240 is formed over carrier 200, conductive layer 232, and conductive pillars 226 using PVD, CVD, printing, spin coating, spray coating, slit coating, rolling coating, lamination, sintering, or thermal oxidation. Insulating layer 240 includes one or more layers of silicon dioxide (SiO2), silicon nitride (Si3N4), silicon oxynitride (SiON), tantalum pentoxide (Ta2O5), Aluminum Oxide (Al2O3), hafnium oxide (HfO2), benzocyclobutene (BCB), polyimide (PI), polybenzoxazoles (PBO), polymer dielectric resist with or without fillers or fibers, or other material having similar structural and dielectric properties. In other embodiments, insulating layer 240 is an encapsulant applied in a molding process. If necessary, insulating layer 240 is planarized using mechanical grinding, chemical mechanical planarization (CMP), or another suitable process to expose conductive pillars 226 and produce top surfaces of the conductive pillars that are coplanar with a top surface of insulating layer 240. In other embodiments, insulating layer 240 is applied using a film-assisted molding process so that conductive pillars 226 are not covered by the molding process.

A conductive layer 222 is formed on insulating layer 240 and conductive pillars 226. Conductive layer 222 is formed and operates similarly to conductive layer 232. Conductive layer 222a is a portion of conductive layer 222 that is operatively connected to circuits later disposed on the substrate. Conductive layer 222a includes contact pads over conductive pillars 226 for electrical connection to conductive layer 232a through the conductive pillars. Conductive layer 222a also includes contact pads for electrical interconnection to subsequently formed conductive layers. In some instances, a conductive layer 222a portion can serve as both a contact pad for connection to a conductive pillar 226a, and also for a subsequently formed conductive pillar over the same contact pad directly opposite conductive pillar 226a.

Conductive layer 222a includes conductive traces or RDL to electrically couple the contact pads to each other as desired for the electrical functionality of the package being formed. Conductive layer 222b is a dummy pattern portion of conductive layer 222. Conductive layer 222b is patterned over and aligned with conductive layer 232b and conductive pillars 226b. In some embodiments, conductive layer 222b is coupled to a portion of conductive layer 222a to provide or receive a ground connection, as illustrated in FIG. 5 below.

In FIG. 2e, conductive pillars 216 are formed over conductive layer 222 in a similar manner to the previous formation of conductive pillars 226. Conductive pillars 216a are used for next-level interconnection while conductive pillars 216b are a dummy pattern formed over and aligned with the previously formed dummy pattern portions of conductive layer 232, conductive pillars 226, and conductive layer 222.

Insulating layer 230 is formed over conductive layer 222 and conductive pillars 216 in a similar manner to insulating layer 240. Insulating layer 230 covers and fills in the spaces between conductive layer 222 and conductive pillars 216. If necessary, conductive pillars 216 are exposed by mechanical planarization, CMP, chemical etching, or other suitable process. The planarization process leaves a top surface of insulating layer 230 that is coplanar with top surfaces of conductive pillars 216. In other embodiments, film-assisted molding is used to apply insulating layer 240 without covering the top surfaces of conductive pillars 216.

Conductive layer 212 is patterned over the top surfaces of insulating layer 230 and conductive pillars 216. Conductive layer 212a includes contact pads for allowing interconnect structures to be provided on the substrate. Conductive layer 212a also includes conductive traces for lateral distribution of electrical signals as desired. Conductive layer 212b is a dummy pattern portion of conductive layer 212 formed over and aligned with conductive layer 232b, conductive pillars 226b, conductive layer 222b, and conductive pillars 216b.

Figure 2F:
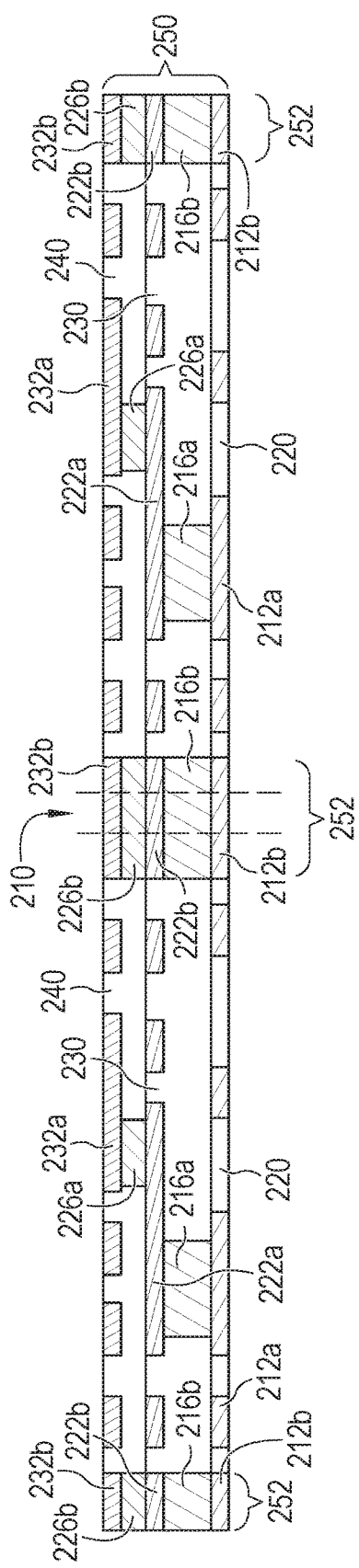

In FIG. 2f, insulating or passivation layer 220 is deposited over conductive layer 212, and carrier 200 is removed, to complete package substrate 250. Package substrate 250 is optionally flipped so that electronic devices within the package are disposed on conductive layer 232, and conductive layer 212 is exposed from the final package for electrical interconnection. Insulating layer 220 is formed in a similar manner to insulating layers 230 and 240. Insulating layer 220 can be planarized with conductive layer 212, or can be left completely covering conductive layer 212. Openings are subsequently formed through insulating layer 220 over contact pads of conductive layer 212a by laser direct ablation, chemical etching, or another suitable process to expose the contact pads for bumping or providing another type of electrical interconnect.

Carrier 200, including seed layer 204, is removed by chemical etching, chemical mechanical planarization (CMP), mechanical grinding, or another suitable process to expose conductive layer 232 and insulating layer 240. Removal of seed layer 204 electrically isolates the various portions of conductive layer 232.

Package substrate 250 includes a plurality of package formation areas in an array. Two package formation areas are shown between three saw streets 210 in FIG. 2f. But generally, many more than two devices are formed at once in a two-dimensional array on packages substrate 250. The package formation areas include conductive layers 212a, 222a, and 232a for lateral distribution of electrical signals, and conductive pillars 216a and 226a to connect vertically between subsequent conductive layers. Package substrate 250 routes electrical signals from the top to the bottom of the package substrate in a fan-in, fan-out, or other configuration, to operate as an interposer or interconnect substrate for a semiconductor package.

Figure 7A:
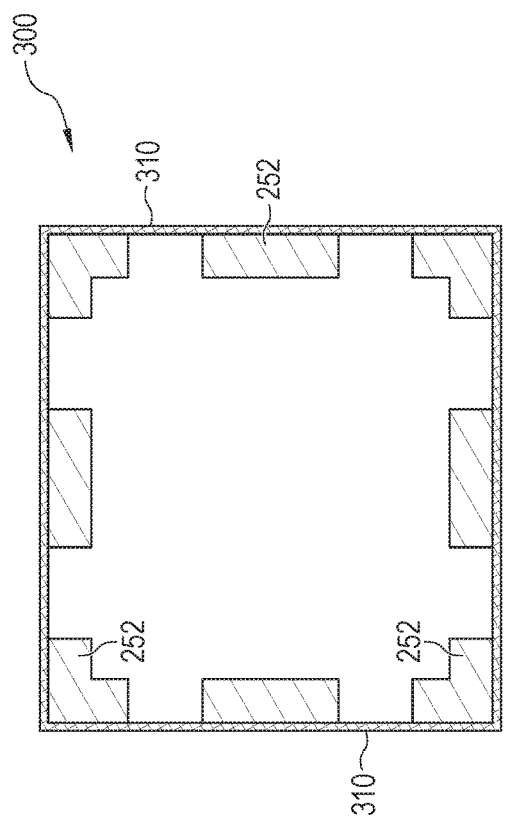
FIGS. 7a-7c illustrate three exemplary dummy conductive structure layouts in plan view.
Figure 7C:
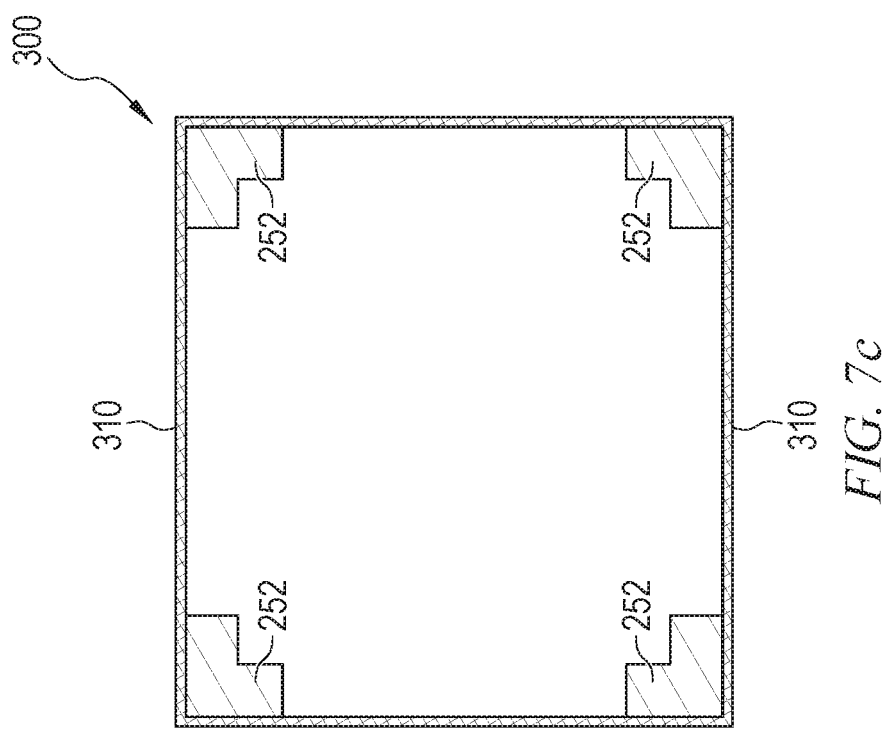
Figure 7B:
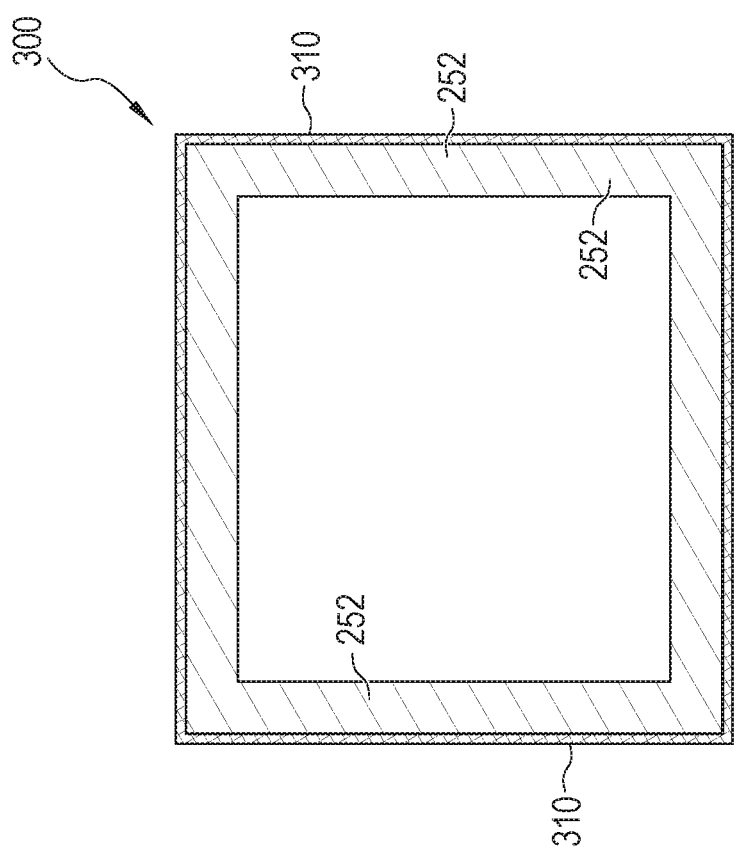

Package substrate 250 includes dummy conductive structures 252 formed in any desired pattern across saw streets 210 of the package substrate. Dummy conductive structures 252 are comprised of a stack of aligned portions of conductive layers 212b, 222b, and 232b and conductive pillars 216b and 226b. Each conductive layer and conductive pillar of dummy conductive structures 252 includes an approximately identical footprint so that the dummy conductive structures as a whole extend approximately uniformly through the entire substrate thickness. FIGS. 7a-7c illustrate three of the many possible patterns for dummy conductive structures 252. While package substrate 250 is shown with three conductive layers connected by two levels of conductive pillars, any numbers of layers are used to form a package substrate in other embodiments.

Figure 3A:
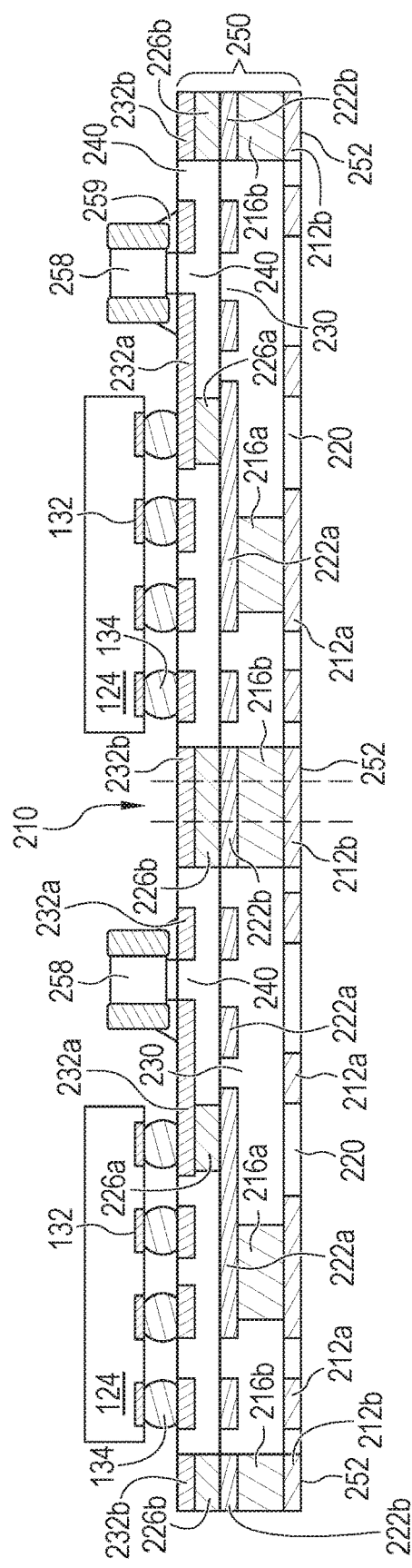

FIGS. 3a-3e illustrate forming a semiconductor package using package substrate 250. In FIG. 3a, semiconductor die 124 and discrete components 258 are mounted onto contact pads of conductive layer 232a. Discrete components 258 can be discrete passive devices, such as inductors, capacitors, and resistors, or can be discrete semiconductor components such as diodes or transistors. Solder paste 259 is printed onto contact pads where discrete components 258 are to be connected, and the discrete components and semiconductor die 124 are disposed over package substrate 250. Heat is applied to reflow solder paste 259 and conductive bumps 134. After reflow, semiconductor die 124 are mechanically bonded and electrically connected to conductive layer 232a through conductive bumps 134, and discrete components 258 are mechanically bonded and electrically connected to conductive layer 232a through solder paste 259. Additional semiconductor die 124 and discrete components 258 with the same or different functionality can be provided to implement any desired electrical functionality. In other embodiments, only passive components are formed and disposed on package substrate 250, e.g., to form a radio frequency (RF) filter network, without semiconductor die 124 or other active devices.

In FIG. 3b, an encapsulant or molding compound 270 is deposited over package substrate 250, semiconductor die 124, and discrete components 258 as an insulating material using a paste printing, compressive molding, transfer molding, liquid encapsulant molding, vacuum lamination, spin coating, or other suitable applicator. Encapsulant 270 can be polymer composite material, such as epoxy resin with filler, epoxy acrylate with filler, or polymer with proper filler. Encapsulant 270 is non-conductive and environmentally protects the semiconductor device from external elements and contaminants. Encapsulant 270 also protects semiconductor die 124 from degradation due to exposure to light. In FIG. 3c, conductive bumps 274 are formed on contact pads of conductive layer 212 in a similar manner to conductive bumps 134 on conductive layer 132.

Figure 3D:
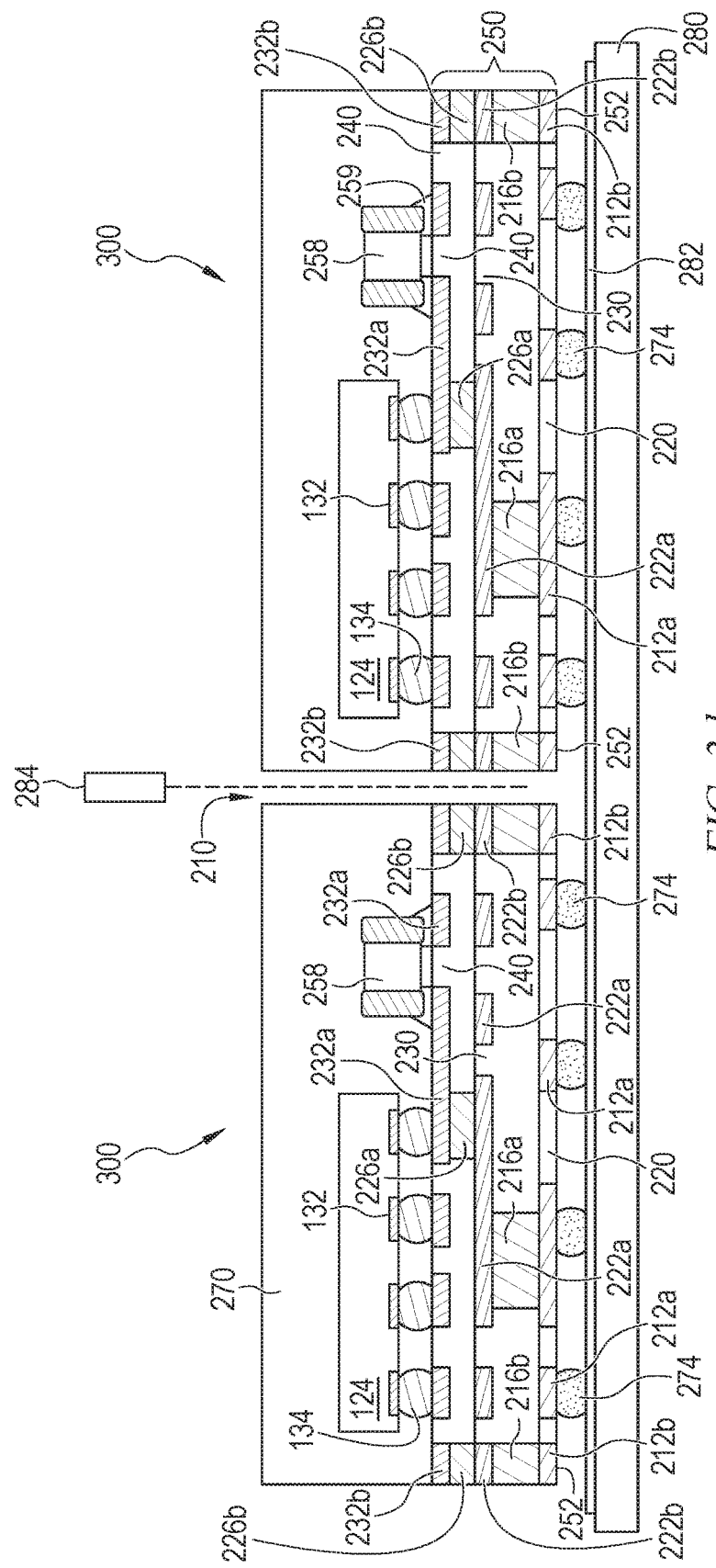

Package substrate 250 with semiconductor die 124, discrete components 258, and encapsulant 270 is disposed on carrier 280 in FIG. 3d. Carrier 280 contains sacrificial base material such as silicon, polymer, beryllium oxide, glass, or other suitable low-cost, rigid material for structural support. An interface layer or double-sided tape 282 is formed over carrier 280 as a temporary adhesive bonding film, etch-stop layer, or thermal release layer.

Once on carrier 280, saw blade or laser cutting tool 284 is used to singulate the panel through encapsulant 270 and dummy conductive structures 252 of package substrate 250 into separate semiconductor packages 300. Singulation through dummy conductive structures 252 leaves side surfaces of conductive layer 212b, conductive pillars 216b, conductive layer 222b, conductive pillars 226b, and conductive layer 232b that are all coplanar with a side surface of encapsulant 270. Dummy conductive structures 252 are exposed at sides of semiconductor packages 300.

Figure 3E:
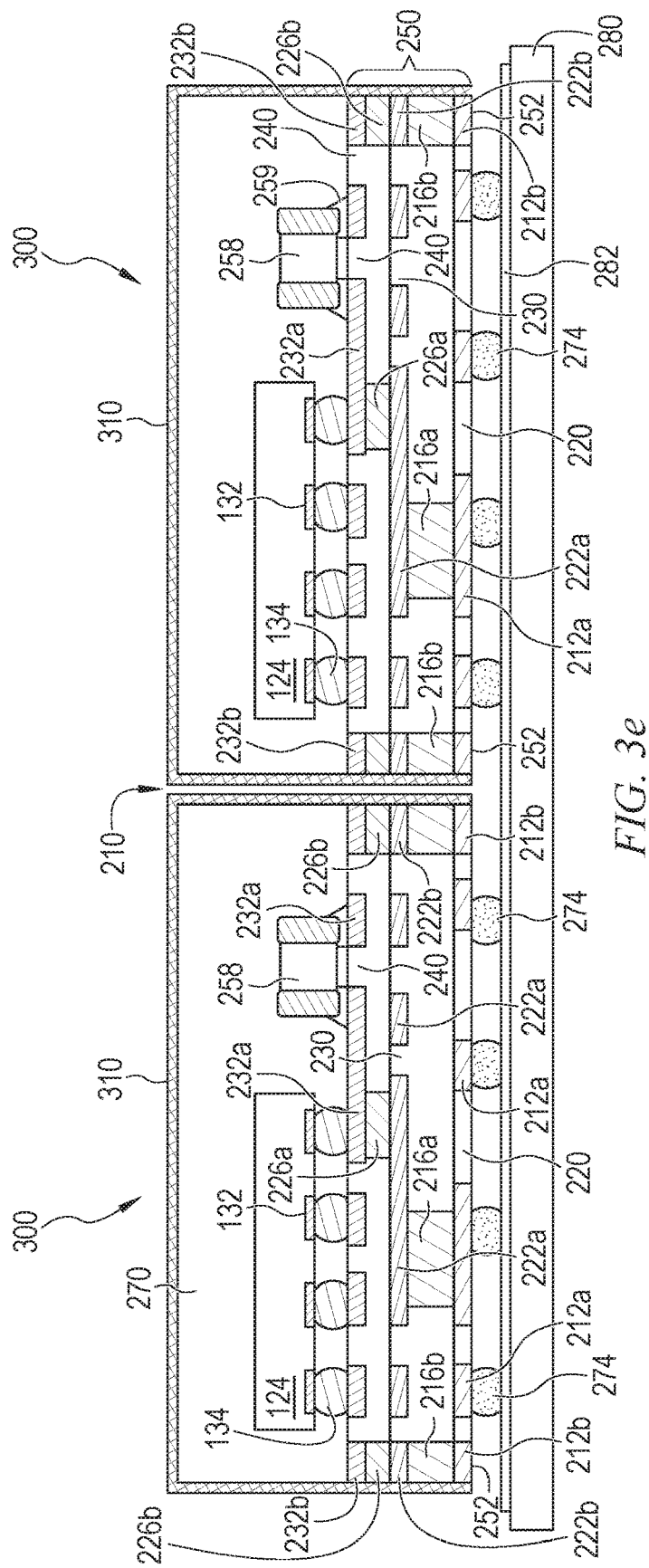

In FIG. 3e, a shielding layer 310 is applied over semiconductor packages 300 using appropriate metal deposition techniques, e.g., CVD, PVD, or electroless plating. Shielding layer 310 covers the top surface and side surfaces of encapsulant 270, as well as the exposed side surfaces of dummy conductive structures 252. The sputtering or plating process results in shielding layer 310 adhering onto the surfaces of encapsulant 270 and dummy conductive structures 252. Shielding layer 310 completely covers the top and all side surfaces of semiconductor packages 300 to provide good coverage for blocking EMI. Shielding layer 310 is electrically connected to dummy conductive structures 252, which improve electrical conductivity of the shielding layer, thus improving shielding performance.

Semiconductor packages 300 are removed from carrier 280 using, e.g., a pick and place operation. Heat or ultraviolet light may be used to reduce the adhesion of interface layer 282, making removal of semiconductor packages 300 easier. Semiconductor packages 300 may be packaged for sale in, e.g., in a tape and reel. FIG. 4 illustrates semiconductor package 300 in use on a PCB or other substrate 312 as part of an electronic device. PCB 312 includes contact pads 314 on a surface of the PCB. Semiconductor package 300 is disposed over PCB 312, and conductive bumps 274 are reflowed to mechanically bond and electrically connect the semiconductor package to the PCB.

Semiconductor die 124 and discrete device 258 are electrically connected to each other, PCB 312, and other electrical components on PCB 312 by conductive layer 232a, conductive pillars 226a, conductive layer 222a, conductive pillars 216a, conductive layer 212a, and conductive bumps 274. The electrical connection allows the functionality of semiconductor die 124 and discrete device 258 to be integrated into an electronic device along with the functionality of other semiconductor packages.

Dummy conductive structures 252 are formed at saw streets of substrate 250, and sit at the edges of semiconductor package 300 after singulation to electrically connect to shielding layer 310. Substrate 250 can be formed with any number of conductive and insulating layers stacked, with each of the conductive layers simply having a portion left within the saw street for dummy conductive structures 252. Shielding layer 310 helps reduce EMI, RFI, and other interference incident on semiconductor package 300 from reaching semiconductor die 124 and discrete device 258. Interference reaching semiconductor die 124 can degrade the performance of the active and passive circuits on the semiconductor die. Shielding layer 310 blocks a significant portion of interference. Dummy conductive structures 252 increase the current handling capability of shielding layer 310 by providing additional cross-sectional area for electrical current flow. The increased current handling capability increases the amount of interference that shielding layer 310 blocks.

FIG. 5 illustrates a semiconductor package 316 having an optional ground connection to dummy conductive structures 252 through conductive layer 222c. Conductive layer 222c is a portion of conductive layer 222 that combines dummy portions 222b with conductive trace portions 222a. Shield layer 310 is electrically connected to a ground voltage node on PCB 312 through conductive bumps 274, conductive layer 212a, conductive pillars 216a, and conductive layer 222c. The ground connection through conductive layer 222c improves shielding capability. Any of the conductive layers of package substrate 250 can be used to connect dummy conductive structures 252 to ground, but only a single layer needs to connect because all of the layers of the dummy conductive structures are vertically connected to each other. In some embodiments, multiple conductive layers connect dummy conductive structures 252 to ground. In other embodiments, different portions of dummy conductive structures 252 are connected to ground by different conductive layers.

Figure 6:
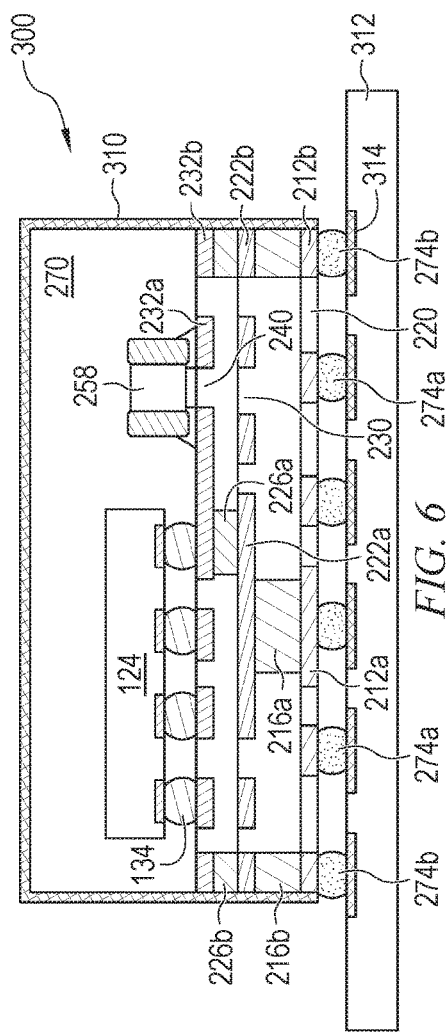
FIG. 6 illustrates the dummy conductive structures directly connected to the printed circuit board through conductive bumps.

FIG. 6 illustrates semiconductor package 300 with dummy conductive structures 252 directly connected to a ground voltage node on PCB 312 using conductive bumps 274b. Conductive bumps 274b are formed on conductive layer 212b at the same time as conductive bumps 274a are formed, and bonded to contact pads 314. Conductive bumps 274 provide a direct electrical connection for dummy conductive structures 252 to PCB 312. The ground connection through conductive bumps 274b improves performance of shielding layer 310 in reducing interference for package 320.

FIGS. 7a-7c illustrate non-limiting options for patterns that dummy conductive structures 252 can be formed in. FIG. 7a shows dummy conductive structures 252 with portions formed at each corner of semiconductor package 300 and separate portions along each side of the package. Each conductive layer, including the conductive layers used to form conductive pillars 216 and 226, are patterned to include portions at the illustrated areas for dummy conductive structures 252 in addition to any portions internal to the package needed for electrically connect semiconductor die 124, discrete device 258, and PCB 312, which are not illustrated in FIGS. 7a-7c. FIG. 7b illustrates dummy conductive structure 252 formed completely around semiconductor package 300. FIG. 7c illustrates dummy conductive structures 252 formed only at the corners of semiconductor package 300. Dummy conductive structures 252 could also be formed only on the sides of semiconductor package 300, or in any other desired pattern.

Figure 8:
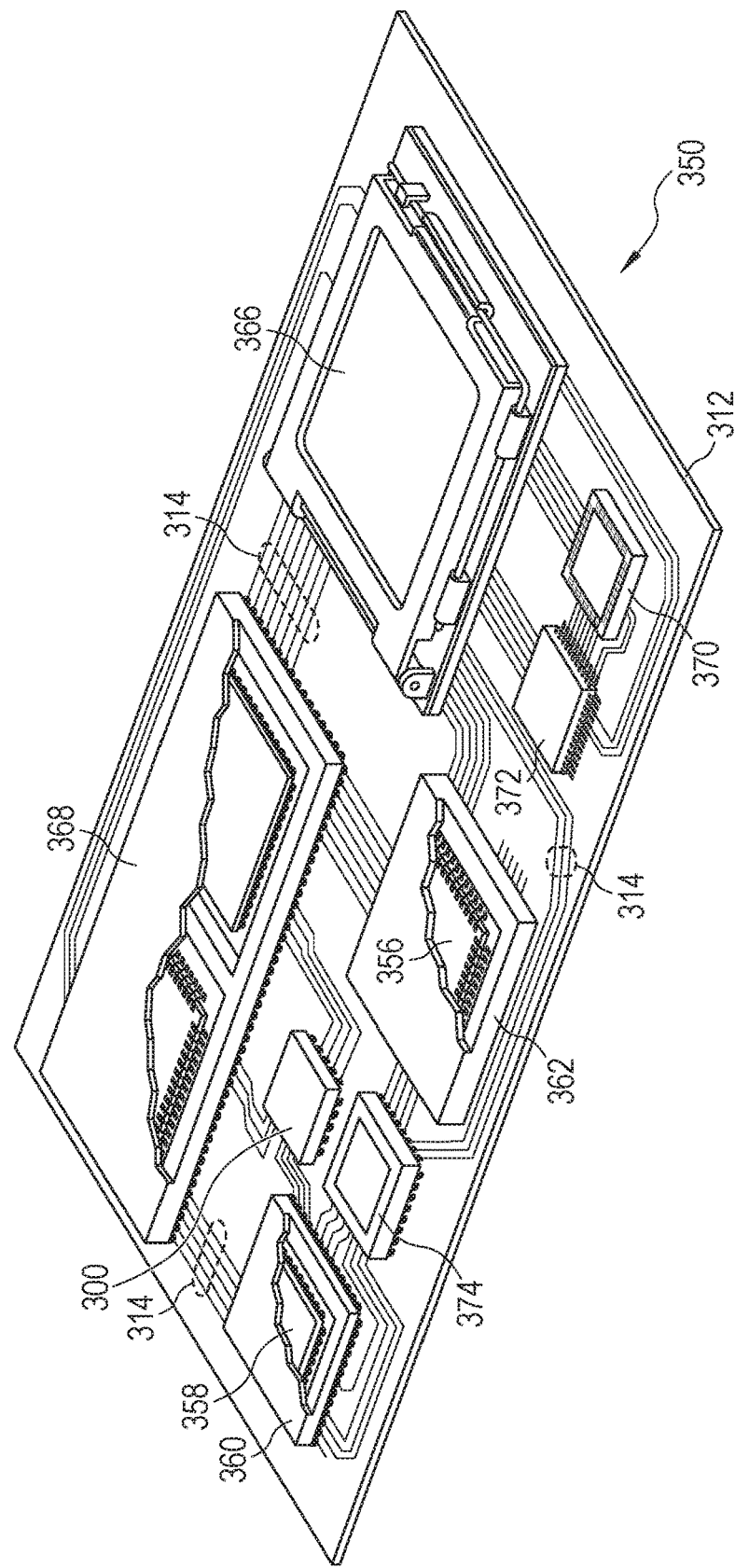
FIG. 8 illustrates the printed circuit board with different types of packages mounted along with the semiconductor package with dummy conductive structures.

FIG. 8 illustrates semiconductor package 300 with shielding layer 310 integrated into an electronic device 350 having a chip carrier substrate or PCB 312 with a plurality of semiconductor packages mounted on a surface of PCB 312 along with semiconductor package 300. Electronic device 350 can have one type of semiconductor package, or multiple types of semiconductor packages, depending on the application.

Electronic device 350 can be a stand-alone system that uses the semiconductor packages to perform one or more electrical functions. Alternatively, electronic device 350 can be a subcomponent of a larger system. For example, electronic device 350 can be part of a tablet, cellular phone, digital camera, communication system, or other electronic device. Alternatively, electronic device 350 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 8, PCB 312 provides a general substrate for structural support and electrical interconnect of the semiconductor packages mounted on the PCB. Conductive signal traces 314 are formed over a surface or within layers of PCB 312 using evaporation, electrolytic plating, electroless plating, screen printing, or other suitable metal deposition process. Signal traces 314 provide for electrical communication between each of the semiconductor packages, mounted components, and other external system components. Traces 314 also provide power and ground connections to each of the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 356 and flipchip 358, are shown on PCB 312. Additionally, several types of second level packaging, including ball grid array (BGA) 360, bump chip carrier (BCC) 362, land grid array (LGA) 366, multi-chip module (MCM) 368, quad flat non-leaded package (QFN) 370, quad flat package 372, and embedded wafer level ball grid array (eWLB) 374. In one embodiment, eWLB 374 is a fan-out wafer level package (Fo-WLP) or fan-in wafer level package (Fi-WLP). Depending upon the system requirements, any combination of semiconductor packages, configured with any combination of first and second level packaging styles, as well as other electronic components, can be connected to PCB 312. In some embodiments, electronic device 350 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   forming a first conductive layer;
   forming a conductive pillar over the first conductive layer;
   forming a second conductive layer, wherein a first portion of the first conductive layer is vertically aligned with a first portion of the second conductive layer and the conductive pillar;
   depositing an encapsulant over the first conductive layer, conductive pillar, and second conductive layer;
   cutting through the encapsulant, the first portion of the first conductive layer, the conductive pillar, and the first portion of the second conductive layer; and
   depositing a third conductive layer contacting side surfaces of the first conductive layer, conductive pillar, second conductive layer, and encapsulant.

2. The method of claim 1, further including:
   forming the first conductive layer to include a second portion separate from the first portion; and
   forming the second conductive layer to include a second portion connecting the first portion of the second conductive layer to the second portion of the first conductive layer.

3. The method of claim 2, further including disposing a conductive bump on the second portion of the first conductive layer, wherein the conductive bump is electrically connected to the first portion of the first conductive layer through the second conductive layer.

4. The method of claim 1, further including:
   disposing a conductive bump on the first portion of the first conductive layer; and
   mounting the semiconductor device to a substrate using the conductive bump.

5. The method of claim 1, further including:
   disposing an electrical component over the first conductive layer and second conductive layer; and
   depositing the encapsulant over the electrical component.

6. The method of claim 1, further including:
   forming an insulating layer over the first conductive layer and second conductive layer; and
   forming a fourth conductive layer including a first portion of the fourth conductive layer vertically aligned with the first portion of the first conductive layer and the first portion of the second conductive layer.

7. The method of claim 1, further including disposing a conductive bump on the first conductive layer.

8. The method of claim 7, further including mounting the semiconductor device to a substrate using the conductive bump.

9. A method of making a semiconductor die, comprising:
   forming a first conductive layer;
   forming a conductive pillar on the first conductive layer;
   forming a second conductive layer on the conductive pillar;
   cutting through the first conductive layer, conductive pillar and second conductive layer; and
   depositing a third conductive layer over side surfaces of the first conductive layer and second conductive layer.

10. The method of claim 9, further including forming the second conductive layer to include a conductive trace connecting first and second portions of the first conductive layer.

11. The method of claim 10, further including disposing a conductive bump on the second portion of the first conductive layer.

12. The method of claim 9, further including disposing a conductive bump on the first conductive layer.

13. The method of claim 9, further including disposing an electrical component over the first conductive layer and second conductive layer.

14. The method of claim 9, further including:
forming an insulating layer around the first conductive layer and second conductive layer; and
forming a fourth conductive layer vertically aligned with the first conductive layer and second conductive layer.

15. A method of making a semiconductor device, comprising:
forming a first conductive layer;
forming a conductive pillar over the first conductive layer
forming a second conductive layer over the conductive pillar and first conductive layer; and
forming a third conductive layer contacting side surfaces of the first conductive layer, conductive pillar, and second conductive layer.

16. The method of claim 15, further including:
depositing an encapsulant over the first conductive layer and second conductive layer; and
forming the third conductive layer over a side surface of the encapsulant.

17. The method of claim 16, further including disposing an electrical component over the second conductive layer in the encapsulant.

18. The method of claim 15, further including forming the second conductive layer to include a conductive trace connecting two portions of the first conductive layer.

19. The method of claim 15, further including forming a bump on the first conductive layer.

20. The method of claim 15, further including:
forming a substrate comprising a plurality of insulating layers and a plurality of conductive layers, wherein the plurality of conductive layers includes the first conductive layer, second conductive layer, and conductive pillar; and
singulating the substrate through the conductive pillar, wherein the plurality of conductive layers occupies an entire height of the substrate within a footprint of the conductive pillar.

* * * * *